United States Patent [19]

Oursler, Jr.

[11] 4,063,199
[45] Dec. 13, 1977

[54] RADIO FREQUENCY PULSE WIDTH AMPLITUDE MODULATION SYSTEM

[75] Inventor: Leonard Lewis Oursler, Jr., Canonsburg, Pa.

[73] Assignee: RCA Corporation, New York, N.Y.

[21] Appl. No.: 767,478

[22] Filed: Feb. 10, 1977

[51] Int. Cl.² ............................................. H03C 1/00
[52] U.S. Cl. ......................................... 332/41; 332/1; 332/10; 332/17; 332/9 R; 332/40
[58] Field of Search ...................... 332/41, 1, 9, 10, 17, 332/4

[56] References Cited

U.S. PATENT DOCUMENTS 3,363,199  1/1968  Besslich .................................. 332/10
3,506,920  4/1970  Swanson ................................. 332/41

Primary Examiner—John Kominski
Attorney, Agent, or Firm—Eugene M. Whitacre; Paul J. Rasmussen; Robert L. Troike

[57] ABSTRACT

Amplitude modulation of a radio frequency carrier is achieved by generating a rectangular wave pulse train at the carrier frequency, the pulses of which vary in width as a function of the amplitude of the audio input signal. The audio frequency input wave is subjected to an arc sine conversion process prior to the generation of the rectangular wave pulse train. The radio frequency pulse width modulated wave is amplified and then filtered to pass the fundamental radio frequency voltage and its modulation side bands.

5 Claims, 4 Drawing Figures

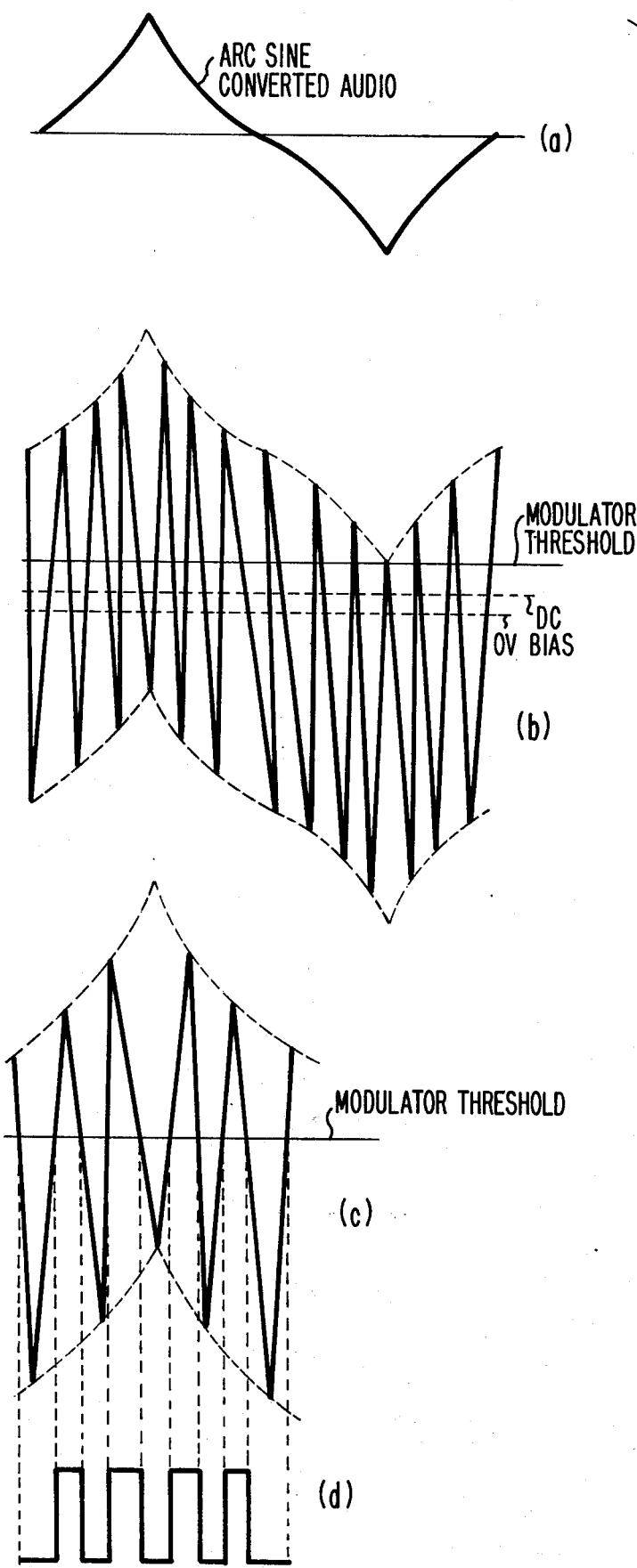
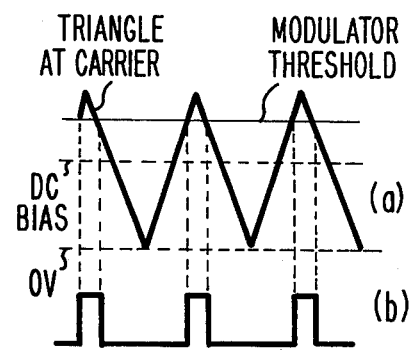
Fig. 3
Fig. 4
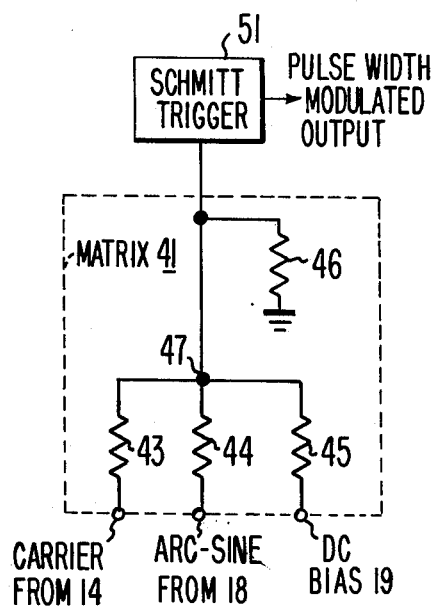
Fig. 2

RADIO FREQUENCY PULSE WIDTH AMPLITUDE MODULATION SYSTEM

BACKGROUND OF THE INVENTION

This invention relates to a system for amplitude modulating a radio frequency carrier and, more particularly, for generating a square wave pulse train, the pulse widths of which vary as a function of the amplitude of the arc sine-converted input audio signal.

Amplitude modulation of a carrier wave can be achieved by generating a rectangular wave pulse train, the pulse widths of which vary as a function of the audio frequency input, and then passing the pulse train through an appropriate band pass filter.

A system for amplitude modulating a high frequency carrier wave is described in U.S. Pat. No. 3,363,199 issued Jan. 9, 1968 entitled "Device for Amplitude Modulating a High Frequency Carrier Wave." The system disclosed therein achieves modulation by generating a rectangular waveform at the carrier frequency wherein the relative pulse width $\phi$ is determined approximately by the relationship:

$$\phi = 2 \arcsin (1 + a)/2$$

wherein $a$ is the instantaneous amplitude of the modulating waveform divided by the value at full modulation.

A sinusoidal waveform at the carrier frequency is in one embodiment of the invention described in U.S. Pat. No. 3,363,199 fullwave rectified and then subtracted from the modulating waveform to which a D.C. voltage having a magnitude of three times the maximum amplitude of the modulating waveform has been added. A flip-flop circuit then generates positive and negative going pulse trains which after amplification are recombined and filtered so as to generate the amplitude modulated carrier. In an alternative embodiment of this patent, the sinusoidal waveform at the carrier frequency is half wave rectified so as to separate the positive and negative half waves of the high frequency sinusoid. The positive and negative half waves are then operated upon so as to generate approximately the desired amplitude modulated carrier.

This prior art arrangement in addition to being complex by operating on a carrier wave to produce the above described relationship also introduces distortions since the carrier signal is rectified and the modulated signal is an unprocessed audio signal.

SUMMARY OF THE INVENTION

A system is provided for amplitude modulating a carrier frequency signal in accordance with a modulating signal. Converting means responsive to the modulating signal generates a signal which is the arc sine of the modulating signal. In response to the arc sine converted modulating signal and a carrier frequency signal having a triangular waveform a pulse width modulated signal is generated. The pulse width modulated signal is amplified and then filtered via a band pass filter so as to produce an amplitude modulated high power signal at the carrier frequency.

BRIEF DESCRIPTION OF THE DRAWINGS

FIG. 2 is a diagram of the pulse width modulator according to the one embodiment of the present invention.

FIG. 3 is a diagram showing the triangular carrier waveform and the resultant rectangular pulse wave train in the absence of an audio signal.

FIG. 4 is a diagram showing the resultant rectangular wave pulse wave train in the presence of an audio signal.

DESCRIPTION OF THE INVENTION

Figure 1:
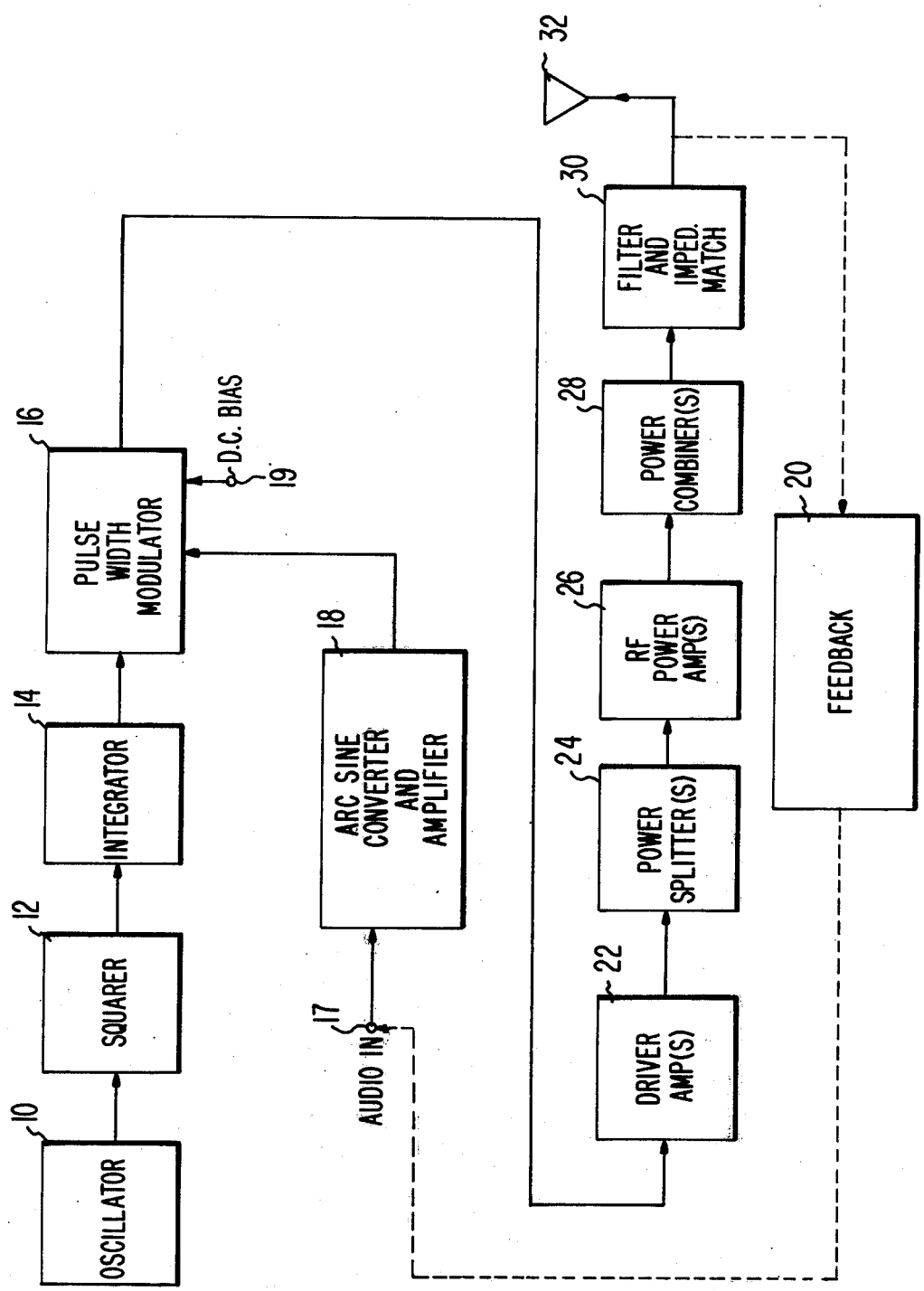
FIG. 1 is a block diagram of the modulation system according to one embodiment of the invention.

Referring to FIG. 1, there is shown a block diagram of the modulation system according to the present invention. An oscillator 10 generates at the desired carrier frequency a waveform which may be either sinusoidal or square. Oscillator 10 may, for example, be a crystal oscillator, a free-running oscillator or a frequency synthesizer. Where the waveform developed by oscillator 10 is sinusoidal, the sinusoid is converted into a square wave at the carrier frequency by squaring circuit 12, which is typically a Schmitt trigger. Hysteresis effects in the transistors comprising the Schmitt trigger may cause the output signal generated by squarer 12 to depart from the desired square wave. Variable resistors may then be used in the Schmitt trigger to compensate for hysteresis and thereby obtain an output signal which has the desired 50 percent duty cycle. Where the output of the oscillator 10 is already a square wave, squaring circuit 12 can be eliminated.

An alternative arrangement for generating a square wave at the carrier frequency is to have an oscillator generate a rectangular waveform the frequency of which is equal to a multiple of the carrier frequency. The rectangular waveform in turn triggers one or more digital dividers which are arranged to have an output waveform which frequency is equal to the desired carrier frequency.

The square wave at carrier frequency is integrated by integrator 14 to produce a triangular waveform at the carrier frequency. Typically integrator 14 comprises an operational amplifier and an RC network. For applications in a modulation system, it may be desirable to increase the linearity of the triangular waveform generated by integrator 14. Therefore, a linearity control such as an adjustable capacitor in the feedback loop of the operational amplifier can be used.

The triangular waveform developed by integrator 14 is one of three input signals to pulse width modulator 16. The other input signals to the pulse width modulator 16 are an arc sine converted audio frequency signal generated by a network 18 and a DC bias signal at terminal 19. The operation of converter and amplifier network 18 is described in detail below.

An audio frequency input signal from a suitable source such as a microphone at terminal 17 is converted and amplified by network 18 such that the output signal is the arc sine of the input signal. A typical circuit for generating an output signal which is the arc sine of the input signal is described in publication PDS-224D, October 1973, published by Burr-Brown Research Corporation, entitled "BB Model 4118/25 Sine/Cosine Function Generator." The circuit for providing arc-sine function is particularly illustrated in FIG. 4. In this circuit arrangement, the maximum peak value of the audio signal to be modulated would be ± 10 volts since the arc sine generator has a peak value of ± 10 volts.

If the input to network 18 is a sinusoidal waveform at audio frequency $\omega_0$, represented by $V_{max} \sin \omega_0 t$ then the output voltage, $V_{out}$, of converting network 18 is determined by:

$$V_{out} = \arc\sin(V_{max} \sin \omega_0 t) \quad (1)$$

Converting network 18 may also include an audio amplifier if the output from the network is not sufficient in amplitude. The audio amplifier of network 18 also provides additional isolation to prevent signals at carrier frequency from being fed back into the audio channel.

The input signals to pulse width modulator 16 are, therefore, the triangular signal generated by integrator 14, the arc sine converted audio signal generated by network 18 and the DC bias volage. The input signals are summed at a resistive matrix 41 located in modulator 16. See FIG. 2. Referring to pulse width modulator of FIG. 2, the input resistive matrix comprises resistors 43, 44, 45 and 46 with resistors 43, 44 and 45 joined together at a common point 47 and to common voltage dividing resistor 46 connected to ground. The opposite terminal end of resistor 43 is connected to integrator 14, the opposite terminal end of resistor 44 is connected to arc sine converter 18 and the opposite terminal end of resistor 45 is connected to the DC bias 19. The junction point 47 of resistors 43, 44, 45 and 46 is connected to the input of Schmitt trigger 51. The matrix provides isolation for the arc sine converted audio signal as it is undesirable to have the triangular signal at carrier frequency fed back into network 18. The voltage at point 47 is determined by the sum of the voltages applied to the resistors 43, 44 and 45. This voltage is applied to the input of the Schmitt trigger. The Schmitt trigger produces at its output a rectangular wave of constant amplitude at the carrier frequency each time the voltage level at junction point 47 exceeds a given threshold value. The rectangular wave has a pulse width which varies as a function of the DC bias level and the relative amplitudes of the triangular waveform and the arc sine converted audio.

Referring to FIG. 3, there is illustrated the generation of the pulse width modulated waveform for the condition in which there is no audio frequency signal. The width of the positive portion of the rectangular wave (FIG. 3b) generated by modulator 16 for this condition depends on the relationship of the amplitude of the triangular waveform, the DC bias level (FIG. 3a), and the threshold voltage of the modulator. The positive peaks of the rectangular wave occur when the amplitude of the triangular waveform is greater than the threshold value. When the amplitude of the triangular waveform falls below the threshold voltage level, the rectangular wave has zero amplitude. Thus, it can be seen from FIG. 3 that the DC bias level in combination with the triangular waveform and the modulator threshold determines the duty cycle of the output rectangular wave in the absence of an audio frequency signal. The DC bias level and the amplitude of the triangular waveform are chosen in the absence of the audio signal such that the width of the positive rectangular pulses determines the required unmodulated carrier power level.

Referring to FIG. 4, there is shown the generation of the pulse width modulated signal (FIG. 4d) in the presence of an audio signal. For simplicity the original audio signal at terminal 17 is assumed to be a sinusoid. FIG. 4a shows the arc sine converted audio signal at the output of converter network 18. The summation of the arc sine converted audio (FIG. 4a), the triangular waveform at carrier frequency and the DC bias level (the sum level at point 47) is shown in FIG. 4b. The effect of the summation is that the arc sine converted audio modulates the envelope of the triangular waveform developed by integrator 14. FIG. 4c shows a portion of the waveform of FIG. 4b which has been enlarged for ease of understanding. When the amplitude of the modulated triangular waveform in combination with the DC bias level at point 47 is above that of the modulator threshold level, (threshold level of Schmitt trigger 51) a positive pulse (FIG. 4d) is generated at the output of modulator 16. When the amplitude of the modulated triangular waveform falls below the modulator threshold level (threshold level of the Schmitt trigger) at point 47 the rectangular waveform has zero amplitude. As the amplitude of the modulated triangular waveform increases, the width increases and correspondingly as the amplitude of the modulated triangular wave decreases, the width decreases.

The pulse width modulated signals at carrier frequency developed by modulator 16 as illustrated in FIG. 1 are coupled to and amplified by drive amplifier(s) 22. Driver amplifiers 22 comprise one or more switching mode amplifiers which are used to provide the power gain necessary to drive the RF power amplifier(s) 26.

The amplified pulse width modulator wave developed by amplifiers 22 is then coupled to RF power amplifier(s) 26. Where more than one RF power amplifier is needed to produce the required carrier level and also the peak output power required during peak positive modulation a power splitter 24 may be necessary. A typical power splitter may be a bank of emitter follower transistor amplifiers having their bases driven in common. The purpose of the power splitter is to allow several power amplifiers to be driven independently by the same input signal so as to provide the necessary carrier level and peak output power. Therefore, where RF amplifier 26 comprises more than one power amplifier, the signals generated by the power splitter 24 drive the inputs to each of the RF power amplifiers. The output signals generated by the RF power amplifiers are then recombined through a power combiner 28. Where only one RF power amplifier is to be used, the power splitter 24 and power combiner 28 need not be used.

The RF power amplifiers 26 are switching power amplifiers which provide the necessary power level. These amplifiers are also designed so as to provide the required peak power output during peak positive modulation.

The output signal generated by the power amplifiers 26 and combiner 28 is the pulse width modulated rectangular wave developed by modulator 16 amplified to the necessary level so as to provide the desired power output. A Fourier analysis of the amplified rectangular wave indicates that the term proportional to the carrier wave frequency $\omega_c$ has an amplitude which varies as a function of the audio frequency input signal $V_{max} \sin \omega_0 t$. Therefore, proper filtering of the amplified rectangular wave can result in the desired amplitude modulated carrier signal and associated side bands. The necessary filtering is provided by output filter and matching network 30.

Network 30 provides the proper band pass filtering of the rectangular waveform so as to remove the unwanted modulation products and the undesirable higher frequency harmonics of the carrier frequency. This network 30 passes with low attenuation signals from $f_m$ below to $f_m$ above the carrier frequency $f_c$ where $f_m$ is the maximum frequency of the modulating signal for which the system is designed. The filter is typically an LC radio frequency circuit. Network 30 in addition to providing bandpass filtering also performs an impedance matching function in that it transforms the output impedance of the RF power amplifier(s) 26 to the useable transmission line impedance for coupling to antenna 32.

As shown in FIG. 1, negative feedback control circuit 20 may be provided to minimize system nonlinearities. The feedback circuit 20 detects the shape of the modulated envelope at the transmitter output (including the distortion being produced by the nonlinearity of the modulation system), phase inverts this detected audio signal and applies a lower level of this detected audio signal to the audio input terminal 17 so that the low level injected feedback signal is 180° out of phase with the modulating audio signal.

What is claimed is:

1. A system for amplitude modulating a carrier frequency signal in accordance with a modulating signal having a maximum frequency of $f_m$, said system comprising:
   converting means responsive to said signal for generating an output signal which is the arc sine of said modulating signal:
   carrier generator means for generating a carrier signal having a substantially triangular waveform at said carrier frequency $f_c$;
   pulse width modulation means responsive to said carrier signal and said converting means output signal for generating a pulse width modulated signal,
   band pass filtering means responsive to said pulse width modulated signal for passing only signals from $f_c - f_m$ to $f_c + f_m$ with low attenuation whereby said carrier frequency is amplitude modulated by said modulating signal.

2. The system according to claim 1 wherein said carrier generator means further includes: oscillation means for generating a signal having a sinusoidal waveform at said carrier frequency,
   square wave generator means responsive to said sinusoidal signal for generating a signal having a substantially square waveform at said carrier frequency, and
   integrating means responsive to said substantially square signal for generating said triangular signal.

3. The system according to claim 2 wherein said square wave generator means further includes adjustable means for varying the duty cycle of said substantially square signal.

4. The system according to claim 1 further including:
   negative feedback means responsive to said amplitude modulated signal at the output of said filtering means for generating a low level feedback having a waveform which is substantially the phase inverted shape of the modulated envelope of said amplitude modulated signal, and
   means for applying said feedback signal to the input of said converting means.

5. The system according to claim 1 including amplifier means coupled to said pulse width modulation means for increasing the magnitude of said pulse width modulated signal.

* * * * *

UNITED STATES PATENT OFFICE
CERTIFICATE OF CORRECTION

PATENT NO. : 4,063,199

DATED : December 13, 1977

INVENTOR(S) : Leonard Lewis Oursler, Jr.

It is certified that error appears in the above-identified patent and that said Letters Patent are hereby corrected as shown below:

In Column 6, line 23 after "feedback" insert -- signal --.

Signed and Sealed this

Twenty-fifth Day of April 1978

[SEAL]

Attest:

RUTH C. MASON
Attesting Officer

LUTRELLE F. PARKER
Acting Commissioner of Patents and Trademarks